United States Patent
Hoentschel et al.

(10) Patent No.: US 8,278,174 B2
(45) Date of Patent: Oct. 2, 2012

(54) IN SITU FORMED DRAIN AND SOURCE REGIONS INCLUDING A STRAIN-INDUCING ALLOY AND A GRADED DOPANT PROFILE

(75) Inventors: Jan Hoentschel, Dresden (DE); Vassilios Papageorgiou, Austin, TX (US); Uwe Griebenow, Markkleeberg (DE)

(73) Assignee: Advanced Micro Devices, Inc., Austin, TX (US)

( * ) Notice: Subject to any disclaimer, the term of this patent is extended or adjusted under 35 U.S.C. 154(b) by 200 days.

(21) Appl. No.: 12/688,999

(22) Filed: Jan. 18, 2010

(65) Prior Publication Data
US 2010/0193882 A1    Aug. 5, 2010

(30) Foreign Application Priority Data
Jan. 30, 2009   (DE) .................. 10 2009 006 884

(51) Int. Cl.
    *H01L 21/336* (2006.01)
(52) U.S. Cl. ................ 438/285; 257/E21.431
(58) Field of Classification Search .......... 257/410, 257/E21.409, E29.255, 347, E21.431, E21.634, 257/E29.054, E29.266, E29.278; 438/285, 438/197, 556, 300, 299
    See application file for complete search history.

(56) References Cited

U.S. PATENT DOCUMENTS

| | | | |
|---|---|---|---|
| 2006/0065937 A1 | 3/2006 | Hoffmann et al. | 257/401 |
| 2006/0148220 A1 | 7/2006 | Lindert et al. | 438/514 |
| 2006/0172511 A1 | 8/2006 | Kammler et al. | 438/481 |
| 2007/0235802 A1* | 10/2007 | Chong et al. | 257/346 |
| 2007/0243688 A1 | 10/2007 | Liao | 438/303 |
| 2007/0252204 A1* | 11/2007 | Wei et al. | 257/347 |
| 2008/0067557 A1 | 3/2008 | Yu et al. | 257/255 |
| 2008/0135873 A1* | 6/2008 | Fiorenza et al. | 257/190 |
| 2008/0157119 A1 | 7/2008 | Tsai | 257/190 |
| 2009/0152634 A1* | 6/2009 | Grant | 257/368 |

FOREIGN PATENT DOCUMENTS

| | | |
|---|---|---|
| EP | 0 949 689 A2 | 10/1999 |
| WO | WO2007/115585 A1 | 10/2007 |
| WO | WO2009/011997 A1 | 1/2009 |
| WO | WO 2009011997 A1 * | 1/2009 |

OTHER PUBLICATIONS

Translation of Official Communication from German Patent Office for German Patent Application No. 10 2009 006 884.8-33 dated Apr. 12, 2010.
Lin et al., "Impact of Source/Drain $Si_{1-y}C_y$ Stressors on Silicon-on-Insulator N-type Metal-Oxide-Semiconductor Field-Effect Transistors," *Japanese Journal of Applied Science*, 46:2107-11, 2007.
PCT Search Report and Written Opinion for PCT/EP2010/000492 dated Jul. 26, 2010.

* cited by examiner

*Primary Examiner* — Victor A Mandala
*Assistant Examiner* — Selim Ahmed
(74) *Attorney, Agent, or Firm* — Wiliams, Morgan & Amerson

(57) ABSTRACT

The dopant profile of a transistor may be obtained on the basis of an in situ doped strain-inducing semiconductor alloy wherein a graded dopant concentration may be established along the height direction. Consequently, the semiconductor alloy may be positioned in close proximity to the channel region, thereby enhancing the overall strain-inducing efficiency, while not unduly compromising the finally obtained dopant profile. Furthermore, additional implant species may be incorporated prior to selectively growing the semiconductor alloy, thereby avoiding implantation-induced relaxation of the internal strain.

18 Claims, 5 Drawing Sheets

IN SITU FORMED DRAIN AND SOURCE REGIONS INCLUDING A STRAIN-INDUCING ALLOY AND A GRADED DOPANT PROFILE

BACKGROUND OF THE INVENTION

1. Field of the Invention

Generally, the present disclosure relates to integrated circuits, and, more particularly, to transistors having complex dopant profiles and including a strain-inducing alloy, such as a silicon/germanium alloy, for creating strain in the channel region.

2. Description of the Related Art

Integrated circuits comprise a large number of circuit elements on a given chip area according to a specified circuit layout, wherein transistors, such as field effect transistors, represent an important component that is used as switching element, current and/or voltage amplifier. The transistors are formed in and above substantially crystalline semiconductor regions with additional dopant materials that are formed at specified substrate locations to act as "active" regions, that is, to act, at least temporarily, as conductive areas for creating a controlled current flow. Generally, a plurality of process technologies are currently practiced, wherein, for complex circuitry, such as microprocessors, storage chips and the like, MOS technology is currently one of the most promising approaches due to the superior characteristics in view of operating speed and/or power consumption and/or cost efficiency. During the fabrication of complex integrated circuits using, for instance, MOS technology, millions of transistors, e.g., N-channel transistors and/or P-channel transistors, are formed on a substrate including a crystalline semiconductor layer. A transistor, irrespective of whether an N-channel transistor or a P-channel transistor or any other transistor architecture is considered, comprises so-called PN junctions that are formed by an interface of highly doped regions, such as drain and source regions, with a lightly doped or non-doped region, such as a channel region, disposed adjacent to the highly doped regions. In the case of a field effect transistor, the conductivity of the channel region, i.e., the drive current capability of the conductive channel, is controlled by a gate electrode formed adjacent to the channel region and separated therefrom by a thin insulating layer. The conductivity of the channel region, upon formation of a conductive channel due to the application of an appropriate control voltage to the gate electrode, depends on the dopant concentration, the mobility of the charge carriers and, for a given extension of the channel region in the transistor width direction, on the distance between the source and drain regions, which is also referred to as channel length. Hence, the conductivity of the channel region substantially affects the performance of the MOS transistors. Thus, the scaling of the channel length, and associated therewith the reduction of channel resistivity, renders the channel length a dominant design criterion for accomplishing an increase in the operating speed of the integrated circuits.

The continuing shrinkage of the transistor dimensions, however, entails a plurality of issues associated therewith that have to be addressed so as to not unduly offset the advantages obtained by steadily decreasing the dimensions of transistors. For example, highly sophisticated dopant profiles, in the vertical direction as well as in the lateral direction, are required in the drain and source regions to provide low sheet and contact resistivity in combination with a desired channel controllability in order to counter so-called short channel effects, such as drain induced barrier lowering and the like. In addition, the vertical location of the PN junctions with respect to the gate insulation layer also represents a critical design criterion in view of leakage current control, as reducing the channel length also requires reducing the depth of the drain and source regions with respect to the interface formed by the gate insulation layer and the channel region, thereby calling for sophisticated implantation techniques.

Furthermore, since the continuous size reduction of the critical dimensions, e.g., the gate length of the transistors, necessitates the adaptation and possibly the new development of highly complex process techniques concerning the above-identified process steps, it has been proposed to also enhance device performance of the transistor elements by increasing the charge carrier mobility, for instance, in the channel region for a given channel length, thereby offering the potential for achieving a performance improvement that is comparable with the advance to a future technology node of down-sized devices while avoiding many of the above process adaptations associated with device scaling. In principle, at least two mechanisms may be used, in combination or separately, to increase the mobility of the charge carriers in the channel region. First, in field effect transistors, the dopant concentration within the channel region may be reduced, thereby reducing scattering events for the charge carriers and thus increasing the conductivity. However, reducing the dopant concentration in the channel region significantly affects the threshold voltage of the transistor device, thereby presently making a reduction of the dopant concentration a less attractive approach unless other mechanisms are developed so as to adjust a desired threshold voltage. Second, the lattice structure in respective semiconductor regions, such as the channel region, may be dilated/stretched, for instance by creating tensile or compressive strain therein, which results in a modified mobility for electrons and holes, respectively. For example, creating uniaxial tensile strain in the channel region of a field effect transistor with respect to the current flow direction increases the mobility of electrons, which in turn may directly translate into a corresponding increase in the conductivity. On the other hand, compressive strain in the channel region may increase the mobility of holes, thereby providing the potential for enhancing the performance of P-type transistors. The introduction of stress or strain engineering into integrated circuit fabrication is an extremely promising approach for further device generations, since, for example, strained silicon may be considered as a "new" type of semiconductor, which may enable the fabrication of fast powerful semiconductor devices without requiring expensive semiconductor materials and manufacturing techniques.

Consequently, it has been proposed to introduce a silicon/germanium alloy in the drain and source regions of P-channel transistors to create compressive stress that may result in a corresponding strain.

With reference to FIGS. 1a-1b, typical conventional approaches will be described for enhancing performance of P-channel transistors with respect to reducing short channel effects, enhancing charge carrier mobility in the channel region and reducing overall series resistance of the drain/source path.

FIG. 1a schematically illustrates a cross-sectional view of a P-channel transistor 100 including a substrate 101, such as a silicon bulk substrate or silicon-on-insulator (SOI) substrate, i.e., a buried insulating layer (not shown) may be formed on the substrate 101. Furthermore, a semiconductor layer 102, such as a silicon layer, is formed above the substrate 101 and may include isolation structures 103, such as shallow trench isolations and the like. The isolation structures 103 may define an "active" region in and above which one or more transistor elements may be formed, such as the transistor 100. It should be appreciated that an active region is to be understood as a semiconductor region receiving or having formed therein appropriate dopant profiles so as to adjust the overall conductivity in accordance with device requirements, for instance for achieving transistor characteristics and the like. In the manufacturing stage shown, a gate electrode structure 104 may be formed above the semiconductor layer 102, wherein a gate insulation layer 104A of the gate electrode structure 104 separates a gate electrode material, such as polysilicon and the like, from a channel region 105 in the semiconductor layer 102. Moreover, as illustrated, the gate electrode structure 104 may have formed on sidewalls thereof a non-electrode material 104B in the form of spacer elements, such as silicon dioxide and the like. Furthermore, the gate electrode structure 104 is encapsulated by spacer elements 107 and a cap layer 108, which may, for instance, be comprised of silicon nitride. Furthermore, recesses or cavities 106 are formed in the semiconductor layer 102 laterally adjacent to and offset from the gate electrode structure 104, wherein a lateral offset is substantially determined by the width of the spacer 104B and the spacer 107.

A typical conventional process flow for forming the transistor 100 as shown in FIG. 1a may comprise the following processes. After forming the isolation structures 103, an appropriate vertical dopant profile within the semiconductor layer 102 may be defined by accordingly designed implantation processes. Thereafter, material layers for the gate electrode structure 104, i.e., a gate dielectric material and an electrode material, may be formed by appropriate techniques, such as thermal or wet chemical oxidation and/or deposition for the gate dielectric, while, frequently, low pressure chemical vapor deposition (LPCVD) may be used for depositing polysilicon as a gate electrode material. Moreover, further material layers, such as material for the cap layer 108, which may act as a portion of an anti-reflective coating (ARC), may also be deposited in accordance with well-established process recipes. The resulting layer stack may then be patterned by advanced photolithography and etch techniques, followed by the formation of the spacer 104B, for instance, by thermal oxidation, deposition and the like. Next, a spacer material may be deposited, for instance in combination with a liner material, if required, which may then be patterned by well-established anisotropic etch techniques to obtain the spacer elements 107, the width of which may substantially determine the lateral offset of the cavities 106.

As previously explained, uniaxial compressive strain in the channel region 105 in the current flow direction may significantly enhance the mobility of holes, thereby enhancing overall performance of the transistor 100 when representing a P-channel transistor. In order to provide the desired compressive strain, the cavities 106 may be formed by well-established etch techniques using the spacers 107 and the cap layer 108 as an etch mask, wherein, in the example shown, the isolation structures 103 may also act as an etch mask. In other cases, an additional hard mask layer may be provided if the lateral extension of the cavities 106 is to be restricted so as to not entirely extend to the isolation structures 103. During the corresponding etch process, a certain amount of template material of the layer 102 may be maintained if an SOI configuration is considered, in which a buried insulating layer may be positioned between the substrate 101 and the semiconductor layer 102. The cavities 106 may be refilled with an appropriate semiconductor material, such as silicon/germanium alloy, which has a natural lattice constant that is greater than the lattice constant of silicon, so that the corresponding epitaxially grown material may be formed in a strained state, thereby also exerting stress to the channel region 105 and thus creating a respective compressive strain therein. Selective epitaxial growth techniques for depositing silicon/germanium alloy materials are well established in the art and may be performed on the basis of appropriately selected process parameters, such as temperature, pressure, flow rate of precursor gases and carrier gases, in such a manner that a significant deposition of material is substantially restricted to the crystalline silicon surfaces, while a deposition on dielectric materials may be suppressed. Moreover, during the deposition of the silicon/germanium material, a desired dopant species may also be incorporated into the deposition atmosphere, such as boron, in order to obtain a desired base doping for drain and source regions, depending on the required complexity of the vertical and lateral profile of the drain and source regions. Generally, a reduced series resistance of the drain and source regions may be achieved by providing high dopant concentrations, while, on the other hand, for highly scaled semiconductor devices, the corresponding electric field generated across the channel region 105 may result in increased charge carrier injection into the gate insulation layer 104A at high dopant concentrations, thereby typically requiring a reduced dopant concentration and a shallow profile of the drain and source regions in the vicinity of the gate electrode structure 104.

FIG. 1b schematically illustrates the transistor 100 in a further advanced manufacturing stage, in which a silicon/germanium alloy 109 may be formed in the cavities 106, as explained above, and wherein the spacers 107 and the cap layer 108 may be removed so as to expose the gate electrode structure 104. It should be appreciated that the spacers 104B may also be removed and may be replaced by appropriately designed offset spacers, if desired. As explained above, upon reducing the transistor dimensions, i.e., the gate length of the transistor 100, which is to be understood as the horizontal dimension of the gate electrode structure 104 in FIG. 1b, controllability of the channel region 105 may become increasingly difficult due to the short channel effects which, in some conventional approaches, may be countered in part by providing counter-doped regions 110, which may also be referred to as halo regions, in which the dopant concentration of the channel region 105 and the remaining semiconductor region, also referred to as the body region 102A, is significantly increased, thereby adjusting the dopant gradient at corresponding PN junctions to be formed by providing shallow doped drain and source regions. Typically, the counter-doped regions or halo regions 110 may be formed by ion implantation, for instance using a tilt angle, in order to establish a certain degree of overlap with the gate electrode structure 104. However, upon further scaling the transistor dimensions, the dopant concentration and thus implantation dose may also have to be increased, thereby also increasing dopant induced charge carrier scattering, dopant diffusion and, due to the high dose implantation processes involved, stress relaxation in the vicinity of the channel region 105. Furthermore, since a dopant concentration in the drain and source regions is generally increased in order to obtain a reduced series resistance of the drain and source regions for not limiting device performance, dose and energy for the implantation process for creating the halo regions 110 also has to be increased. This, in turn, may further increase stress relaxation in the silicon/germanium alloy due to increased lattice damage and higher dopant diffusion. During the sophisticated implantation processes, longer treatment times may be required so as to obtain the desired high dose during the creation of the halo regions 110. Thus, although the silicon/germanium material 109 may be provided with high intrinsic dopant concentration, nevertheless sophisticated and long implantation processes may be required for adjusting the PN junctions in the vicinity of the gate electrode structure 104 on the basis of the halo regions 110.

Due to the significant strain relaxation caused by the preceding implantation processes, it has also been proposed to incorporate the silicon/germanium alloy at a later manufacturing stage, i.e., after incorporating the dopant species for the extension regions and the halo regions in order to avoid implantation-induced damage. Furthermore, corresponding to this strategy, the silicon/germanium alloy has to be highly doped to provide the corresponding high dopant concentration for the deep drain and source areas. Consequently, the intrinsic strain component may be substantially maintained and may thus provide enhanced internal strain from the silicon/germanium alloy. On the other hand, however, a lateral distance of the heavily doped silicon/germanium alloy may be required with respect to the channel region since a moderately high dopant gradient may result in a significant dopant diffusion, which may result in a reduced conductivity in the channel region, if increasingly dopant atoms may be incorporated therein. The problem may even further become relevant when a certain degree of dopant diffusion is desirable in order to increase depth of the heavily doped drain and source areas, for instance so as to connect to a buried insulating layer in order to reduce the parasitic junction capacitance in SOI devices. Since both a high internal strain level of the silicon/germanium material and the lateral distance to the channel region substantially determine the overall strain component induced in the channel region, the advantage gained by reducing the implantation-induced relaxation may be compensated for or even over-compensated for by requiring an increased offset of the in situ doped silicon/germanium material so that the approach may be less than desirable, in particular for sophisticated applications in which the deep drain and source regions have to extend down to the buried insulating layer in partially depleted SOI transistors. On the other hand, the reduction of the offset of heavily in situ doped silicon/germanium material may not represent an attractive approach since the significant dopant diffusion may contribute to an overall drain and source dopant profile, which may finally result in increased leakage currents, which may finally lead to total failure of the transistor.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

In general, the present disclosure relates to methods and transistor devices in which complex vertical and lateral dopant profiles may be established in the drain and source regions on the basis of a selective epitaxial growth process for incorporating a strain-inducing semiconductor alloy, which may be provided with a specifically designed in situ dopant concentration, which may result in the desired profile. To this end, the in situ dopant concentration may be provided as a graded dopant profile in which the drain/source dopant species may be provided with a different concentration at different height levels within the epitaxially grown material, wherein a degree of dopant diffusion may thus be determined by the vertical distribution of the dopant species in combination with appropriately selected process parameters for one or more anneal processes, which may generally be performed at a significantly lower temperature compared to conventional strategies. According to other aspects disclosed herein, the in situ doped semiconductor alloy may be advantageously combined with one or more implantation steps, which may be performed prior to the epitaxial growth process so as to avoid implantation-induced damage, while nevertheless providing enhanced flexibility in designing the overall dopant profile. In some illustrative embodiments disclosed herein, the implantation process may be performed through the corresponding cavities, thereby providing enhanced process efficiency, in particular in sophisticated semiconductor devices in which the gate height may not provide sufficient ion blocking capability to allow implantation species to be positioned close to the buried insulating layer of an SOI device. Thus, by incorporating at least a portion of the drain/source dopant species through the cavities, significantly lower implantation energies may be used, thereby avoiding or at least significantly reducing the probability of implanting drain/source dopant species into the channel region through the gate electrode structure.

Hence, a very efficient manufacturing sequence for providing sophisticated drain and source regions may be accomplished since the number of complex spacer fabrication steps and lithography steps for forming drain and source regions compared to conventional techniques may be reduced.

One illustrative method disclosed herein comprises forming cavities in an active region of a transistor laterally adjacent to a gate electrode structure which comprises a gate dielectric material, an electrode material formed on the gate dielectric material and an offset sidewall spacer. The method further comprises forming a strain-inducing semiconductor alloy in the cavities, wherein the strain-inducing semiconductor alloy comprises a dopant species having a varying dopant concentration along a height direction of the cavities. Additionally, the method comprises performing a heat treatment to form drain and source extension regions on the basis of the varying dopant concentration of the dopant species, wherein the drain and source extension regions connect to a channel region of the transistor.

A further illustrative method disclosed herein relates to forming drain and source regions of a transistor. The method comprises implanting a first portion of a drain and source dopant species through cavities into an active region of the transistor. Additionally, the method comprises forming a strain-inducing semiconductor alloy in the cavities, wherein the strain-inducing semiconductor alloy comprises a second portion of the drain and source dopant species that has a graded concentration with respect to a height direction of the cavities. Finally, the method comprises performing at least one heat treatment to form a final dopant profile of the drain and source regions on the basis of the first and second portions of the drain and source dopant species.

One illustrative transistor device disclosed herein comprises a gate electrode structure formed above a channel region and drain and source regions formed in an active semiconductor region laterally adjacent to the channel region. Furthermore, the transistor device comprises a strain-inducing semiconductor alloy formed within the drain and source regions, wherein the strain-inducing semiconductor alloy has a graded dopant concentration along a height direction of the drain and source regions.

BRIEF DESCRIPTION OF THE DRAWINGS

The disclosure may be understood by reference to the following description taken in conjunction with the accompanying drawings, in which like reference numerals identify like elements, and in which.

Figure 1A:
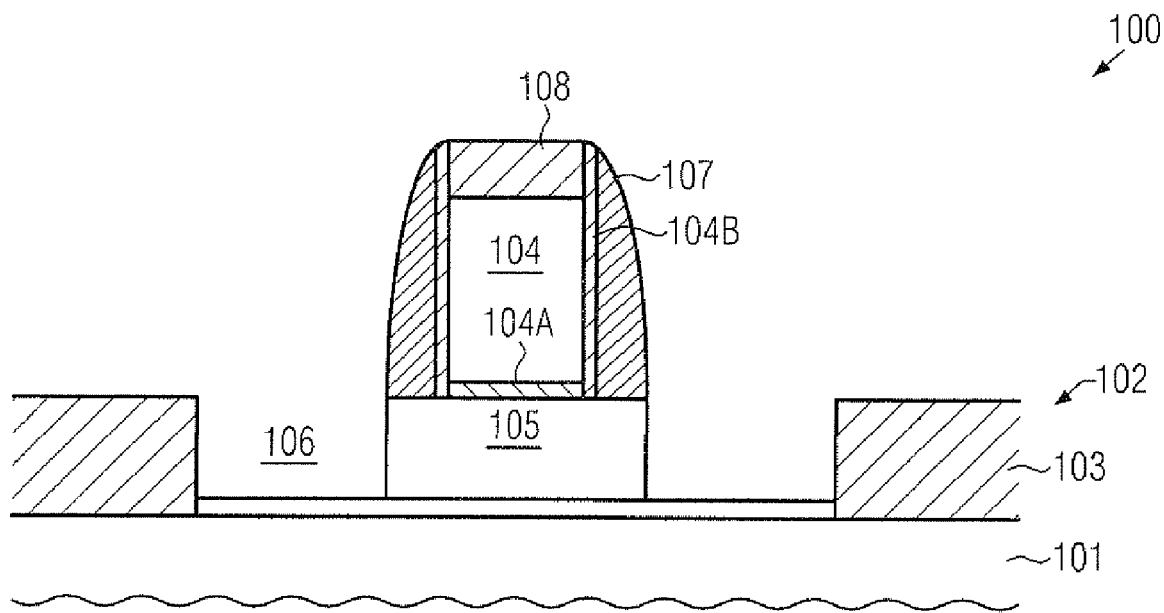
FIGS. 1a-1b schematically illustrate cross-sectional views of a transistor during various manufacturing stages in forming drain and source regions on the basis of an epitaxially grown semiconductor alloy with in situ doping and subsequent implanted halo regions, according to conventional strategies.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present disclosure addresses the problem of increased complexity of manufacturing techniques in which sophisticated drain and source dopant profiles may be accomplished on the basis of selective epitaxial growth techniques in combination with implantation processes. A significant reduction of the overall process complexity may be accomplished according to the principles disclosed herein by providing a graded in situ dopant concentration in a strain-inducing semiconductor alloy, which may thus be positioned closely to the channel region of the transistor. Furthermore, in combination with appropriately designed anneal processes, which may be performed at lower temperatures, the graded dopant profile in the strain-inducing semiconductor alloy may result in the desired lateral and vertical profile of the drain and source regions, wherein, in some illustrative embodiments disclosed herein, additionally, the depth of the drain and source regions may be separately adjusted on the basis of an implantation process or any other process for incorporating the drain and source dopant species prior to actually growing the strain-inducing semiconductor alloy. For this purpose, in one illustrative embodiment, the drain and source dopant species for the deep drain and source areas may be incorporated through the corresponding cavities so that the dopant species may be positioned at any desired depth within the active region, for instance at the interface to a buried insulating layer, without requiring unduly high implantation energies. Consequently, the integrity of the channel region and of sensitive gate dielectric materials may be preserved during the corresponding implantation process, even if a reduced gate height may be required due to a reduction of the fringing capacitance, or a less critical surface topography caused by the gate electrode structures. In still other illustrative embodiments, other species may be incorporated, such as counter-doping species for forming halo regions or any other type of material species that may be used for adjusting the overall electronic characteristics of the transistor, for instance by positioning species for defining energy traps at shallow areas of the drain and source regions, which may also be accomplished by implantation techniques performed through the cavities prior to depositing the strain-inducing semiconductor alloy. Consequently, the entire dopant profile may be defined on the basis of the single configuration of the gate electrode structure without requiring complex spacer configurations, thereby contributing to a reduced complexity of the overall manufacturing flow. Furthermore, in some illustrative embodiments, the deep drain and source regions as well as the halo regions and any other additional implantation species may be incorporated on the basis of the same lithography mask, so that the number of masking steps may be reduced compared to conventional strategies, thereby also contributing to a reduced and thus cost-efficient manufacturing flow. Moreover, since sophisticated spacer techniques may not be required for defining a dopant profile of the drain and source regions, any additional spacer elements which may be used for forming metal silicide regions may be specifically adjusted with respect to enhancing performance of the silicidation process, without necessitating any compromises with respect to also providing an implantation mask for defining deep drain and source regions, as may be the case in many conventional approaches. It should be appreciated that the principles disclosed herein may be highly advantageous in the context of sophisticated semiconductor devices in which transistor elements of critical dimensions of 50 nm and less may be provided, since, here, typically, performance enhancing mechanisms may be required, such as the incorporation of strain-inducing semiconductor alloys, while at the same time sophisticated drain and source profiles may be required in view of channel controllability and the like, as previously explained. In some illustrative embodiments disclosed herein, the sophisticated manufacturing flow and the resulting drain and source profiles may be applied in combination with advanced gate configurations including high-k dielectric materials, which may be understood as dielectric materials having a dielectric constant of 10.0 or higher, in combination with metal-containing electrode materials. Also, in this case, significant advantages may be gained, for instance, by using anneal techniques of reduced temperature, which may reduce the probability of creating defects in sensitive high-k dielectric material, wherein, additionally, an offset spacer element used for defining an offset of cavities to be etched in the active region may provide enhanced integrity of sensitive high-k materials without requiring additional spacer elements.

Figure 1B:
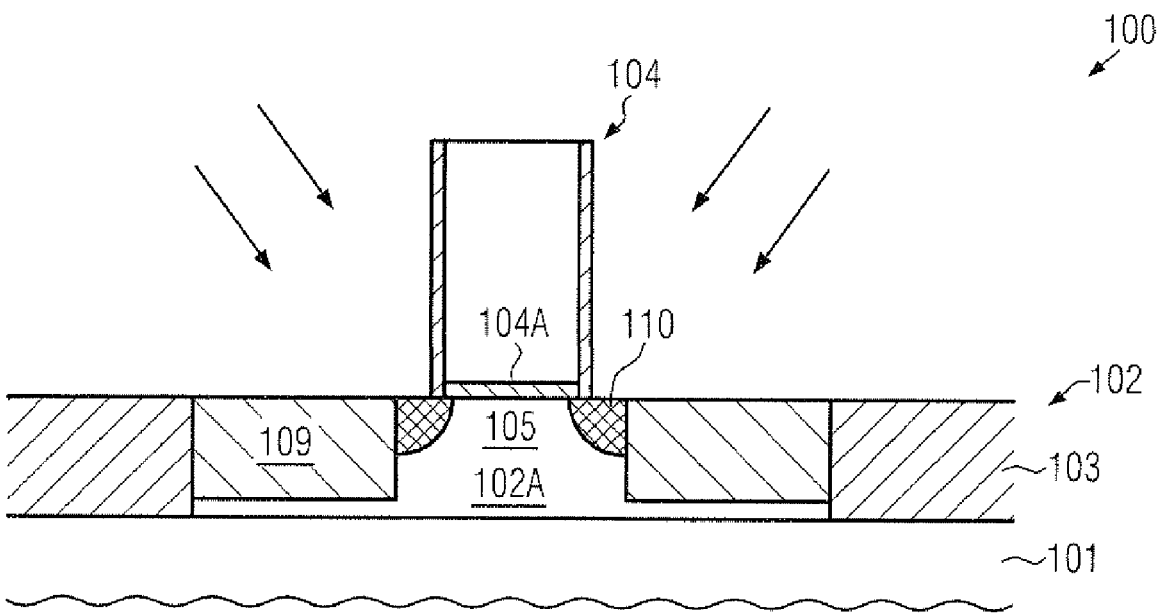

With reference to FIGS. 2a-2h, further illustrative embodiments will now be described in more detail, wherein reference may also be made to FIGS. 1a-1b, if required.

Figure 2A:
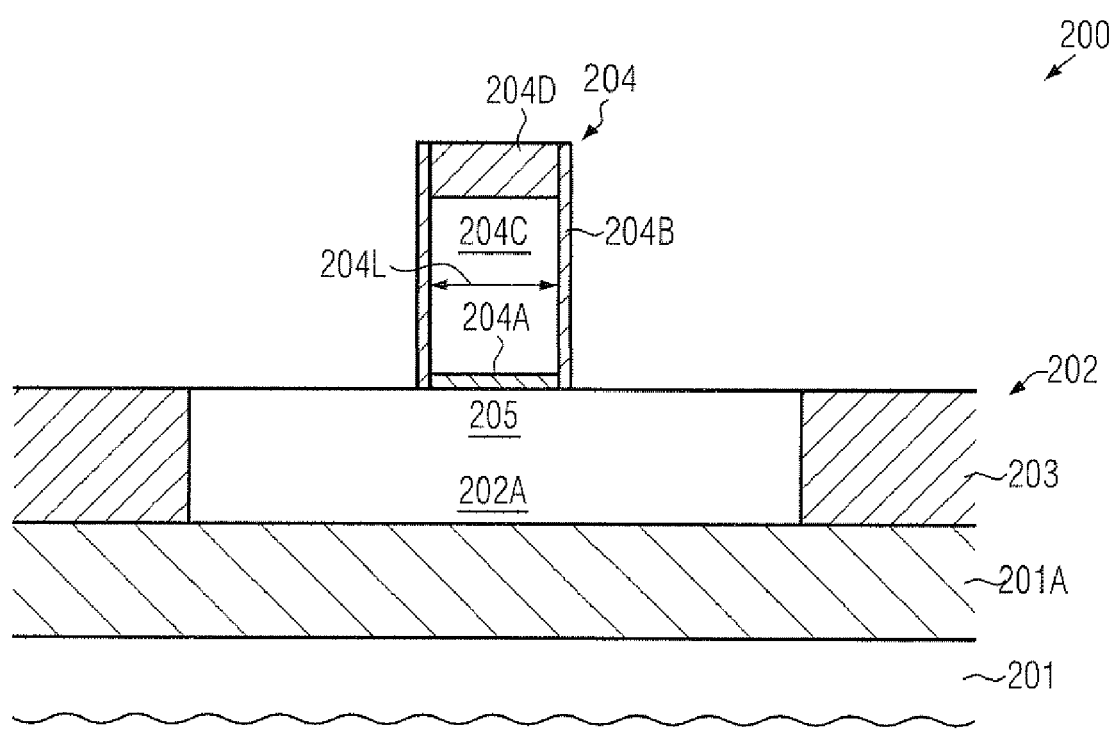
FIGS. 2a-2h schematically illustrate cross-sectional views of a transistor device during various manufacturing stages wherein a sophisticated drain and source dopant profile may be obtained on the basis of a graded in situ doping of a strain-inducing semiconductor alloy, according to illustrative embodiments.

FIG. 2a schematically illustrates a cross-sectional view of a semiconductor device 200, which may be provided in the form of transistors, such as a P-channel transistor, that may receive a semiconductor alloy in drain and source areas by a selective epitaxial growth technique so as to provide a graded in situ dopant profile. The device 200 may comprise a substrate 201, above which may be formed a semiconductor layer 202, such as a silicon-based layer, which may be understood as a material layer having incorporated therein a significant amount of silicon, possibly in combination with other materials, such as germanium, carbon, fluorine and the like. Furthermore, in the embodiment shown, a buried insulating layer 201A may be provided between the substrate 201 and the semiconductor layer 202, thereby forming an SOI architecture, which may be advantageous, for instance, with respect to a reduced junction capacitance, as previously explained. In other illustrative embodiments (not shown in FIG. 2a), the buried insulating layer 201A may be omitted, as is, for instance, described with reference to the transistor 100 of FIGS. 1a-1b. Furthermore, the device 200 may comprise a gate electrode structure 204, which may include a gate electrode material 204C in the form of any appropriate conductive material, such as polysilicon, metal-containing materials and the like. For example, in sophisticated semiconductor devices, an enhanced conductivity may be required, which may be accomplished by providing a metal-containing material, which may be provided, possibly in combination with other materials, such as polysilicon, at an early manufacturing stage. For instance, a corresponding metal-containing electrode material, such as titanium nitride, possibly in combination with additional species, may be provided in the material 204C so as to be formed on a gate insulation layer 204A, which may be provided in the form of any appropriate dielectric material, such as silicon dioxide, silicon oxynitride, silicon nitride and the like, wherein a thickness may have to be adapted to a length of the gate electrode structure 204, as previously explained. In some cases, in the gate insulation layer 204A, a high-k dielectric material may be included in the layer 204A, thereby providing enhanced controllability of a channel region 205 at reduced leakage currents compared to conventional dielectric materials. For example, the gate insulation layer 204A may comprise materials such as hafnium oxide, hafnium silicon oxide and the like, while, additionally, a metal-containing material may be formed on the layer 204A, thereby substantially avoiding the creation of a depletion zone, as may frequently be observed in gate electrodes formed on the basis of a polysilicon material. It should be appreciated that, in some illustrative embodiments, the gate length, i.e., the length of the electrode material 204C, as indicated as 204L, may be approximately 50 nm and less, since typically for such applications sophisticated drain and source profiles may be required in combination with additional performance enhancing mechanisms, as already discussed above. Moreover, in the embodiment shown, the gate electrode structure 204 may comprise an offset spacer element 204B, which may be comprised of any appropriate material, such as silicon nitride and the like, wherein a width of the spacer 204B may substantially determine a lateral offset of cavities to be formed laterally adjacent to the gate electrode structure 204 in the semiconductor layer 202, i.e., in corresponding active region 202A of the device 200. Thus, the spacer element 204B may, in combination with a cap material 204D, preserve integrity of the electrode material 204C and the gate insulation layer 204A. For instance, high-k dielectric materials may exhibit pronounced sensitivity during a plurality of wet chemical etch processes, for instance processes including hydrofluoric acid and the like, which may be required for removing contaminants and the like. Thus, the spacer element 204B may encapsulate the gate insulation layer 204A and may additionally provide a high etch resistivity during the subsequent processing for forming corresponding cavities in the active region 202A. Furthermore, the cap layer 204D, which may be comprised of silicon nitride and the like, may act as an etch mask and a growth mask during the subsequent processing.

With respect to any manufacturing techniques and characteristics of the device 200, it may also be referred to the corresponding description given with reference to the device 100, wherein it should be appreciated that the cap material 204D and the offset spacer 204B may be appropriately selected in terms of material composition and thickness so as to comply with the further process requirements. For example, as previously discussed with reference to the cap layer 108 (FIG. 1a), the cap material 204D may be patterned along with at least a portion of the gate electrode material 204C, wherein the patterning sequence may depend on the composition of the electrode material 204C. For example, appropriate metal species may be deposited, for instance in combination with a polysilicon material, when sophisticated gate electrode structures are considered. Similarly, the gate insulation layer 204A may be provided on the basis of any appropriate manufacturing technique. Thereafter, a spacer material may be deposited, for instance, by thermally activated chemical vapor deposition (CVD) techniques so as to obtain a highly dense material and a well-controlled thickness. Thereafter, the spacer layer may be patterned on the basis of well-established anisotropic etch techniques, thereby obtaining the spacer 204B having the required etch resistivity and width that is appropriate for the further processing. For example, the spacer 204B may have a width of approximately one nanometer to several nanometers, depending on the desired offset of a cavity to be formed in the region 202A.

Figure 2B:
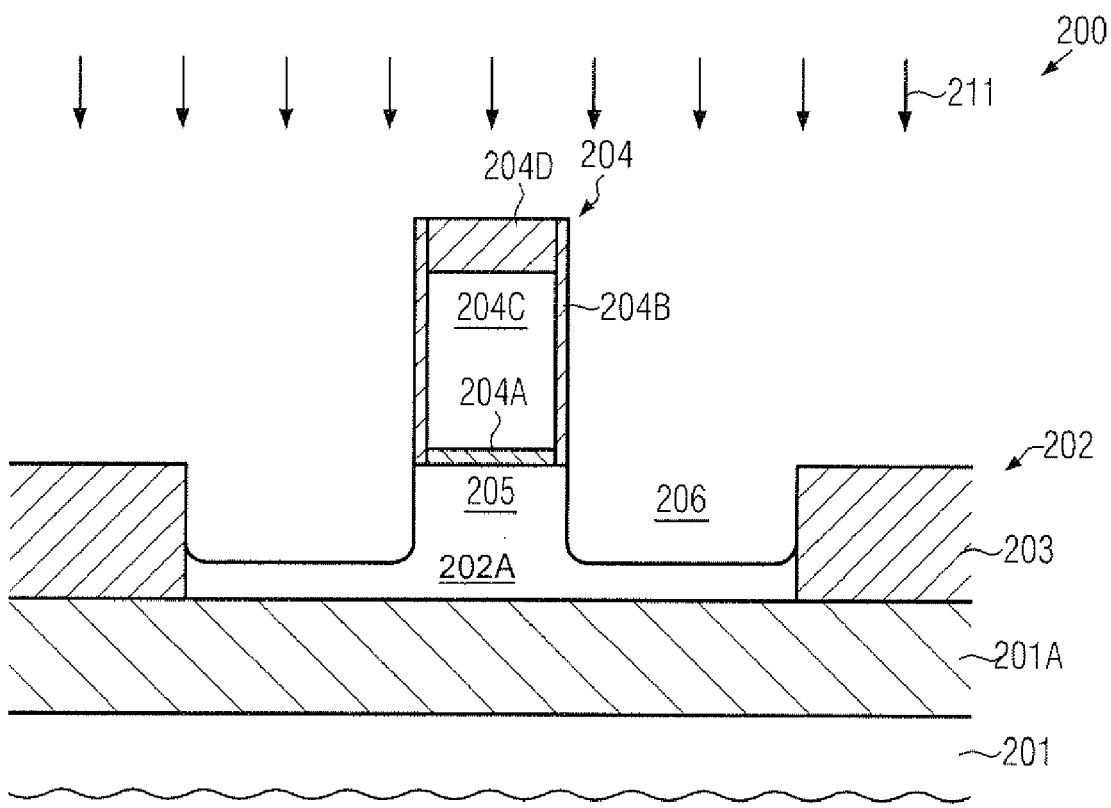

FIG. 2b schematically illustrates the semiconductor device 200 when exposed to an etch ambient 211, which may be established on the basis of a plasma assisted ambient using an etch chemistry, for instance on the basis of fluorine, chlorine and the like, in order to remove material of the region 202A selectively to the gate electrode structure 204 and also to the isolation structure 203, wherein, however, a corresponding etch resistivity may be less pronounced compared to the cap layer 204D and the spacer 204B. During the etch process 211, cavities 206 may be formed with a lateral offset with respect to the electrode material 204C that is substantially determined by the spacer 204B and the etch parameters of the process 211.

Figure 2C:
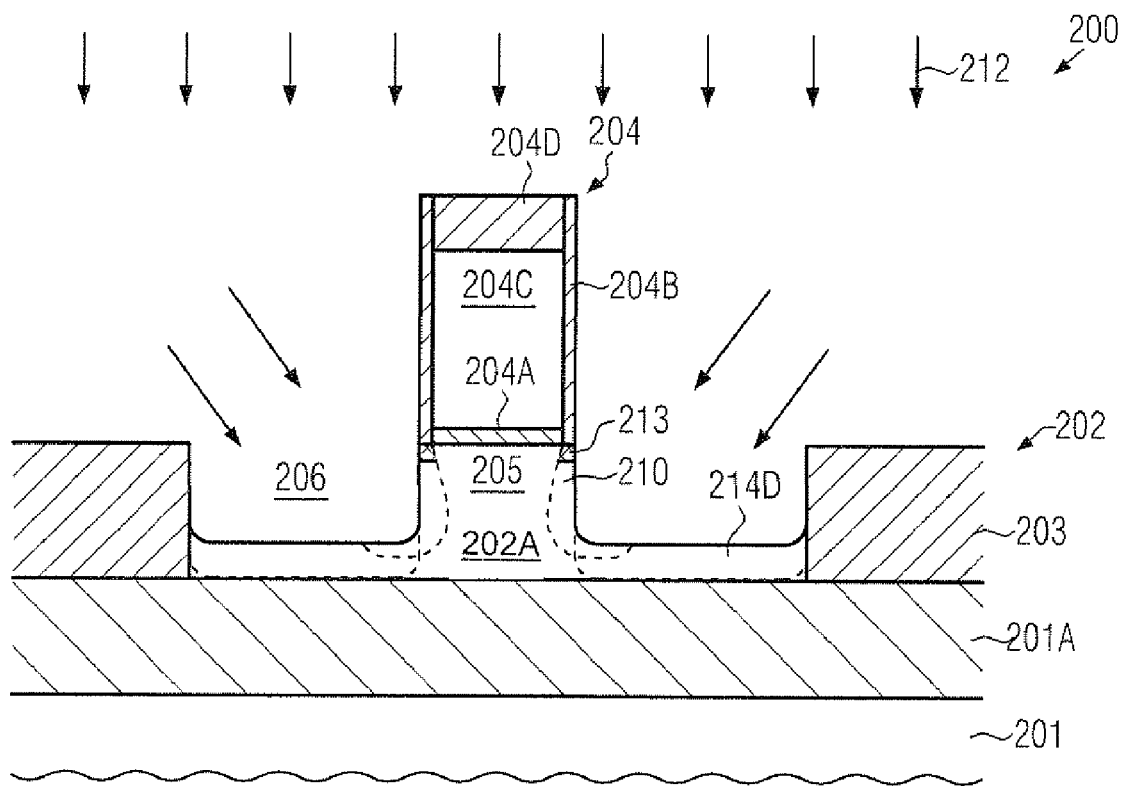

FIG. 2c schematically illustrates the device 200 during an ion implantation sequence 212 according to one illustrative embodiment in order to introduce one or more dopant species into the region 202A on the basis of the cavities 206. In one illustrative embodiment, the implantation process 212 may comprise an implantation step for introducing a portion of a drain and source dopant species, which may be indicated by 214D, which may correspond to deep drain and source regions, while the finally desired profile may be established on the basis of one or more further heat treatments, which cause a certain degree of dopant diffusion, if desired. As illustrated, the actual penetration depth for incorporating the deep drain and source species 214D may be significantly reduced due to the presence of the cavities 206, so that a moderately low implantation energy may be applied, while nevertheless depositing the species 214D so as to extend to a target depth, for instance at least to the buried insulating layer 201A. Due to the moderately low implantation energy, the ion blocking capability of the gate electrode structure 204 may reliably provide integrity of the channel region 205 so that, in general, reduced gate heights may be used, which may be advantageous in view of a reduced fringing capacitance of the gate electrode 204 and also in view of a less pronounced surface topography. Moreover, the implantation sequence 212 may comprise one or more additional implantation steps for incorporating the dopant species, for instance a counter-doping species, to define a counter-doped or halo region 210, which may be accomplished on the basis of an appropriate tilt angle, wherein a symmetric or asymmetric configuration of the halo regions 210 may be applied, depending on the overall device requirements. As is illustrated, also in this case, a moderately low penetration depth may be required and thus corresponding reduced implantation energies may be used. In some illustrative embodiments, the implantation sequence 212 may also comprise an amorphization implantation, which may be performed as a tilted implantation process, when corresponding channeling effects during the incorporation of the counter-doping species for the halo region 210 may be considered inappropriate. Thus, in this case, a certain portion may be amorphized, thereby enhancing the uniformity of dopant penetration for defining the halo regions 210. It should be appreciated that significant amorphization of the material at the bottom of the cavities 206 may be avoided by using an appropriate tilt angle. Furthermore, the implantation sequence 212 may comprise one or more additional implantation steps, in which any other appropriate species, such as fluorine, carbon and the like, may be introduced in order to define a shallow implantation region 213, depending on the overall electronic characteristics of the device 200. Thus, the deep drain and source species 214D, the halo region 210, any further shallow implantation species and possibly a corresponding amorphization process may be performed without requiring a change of implantation mask or without additional spacer elements, thereby contributing an overall enhanced manufacturing and thus cost-efficient process technique.

Figure 2D:
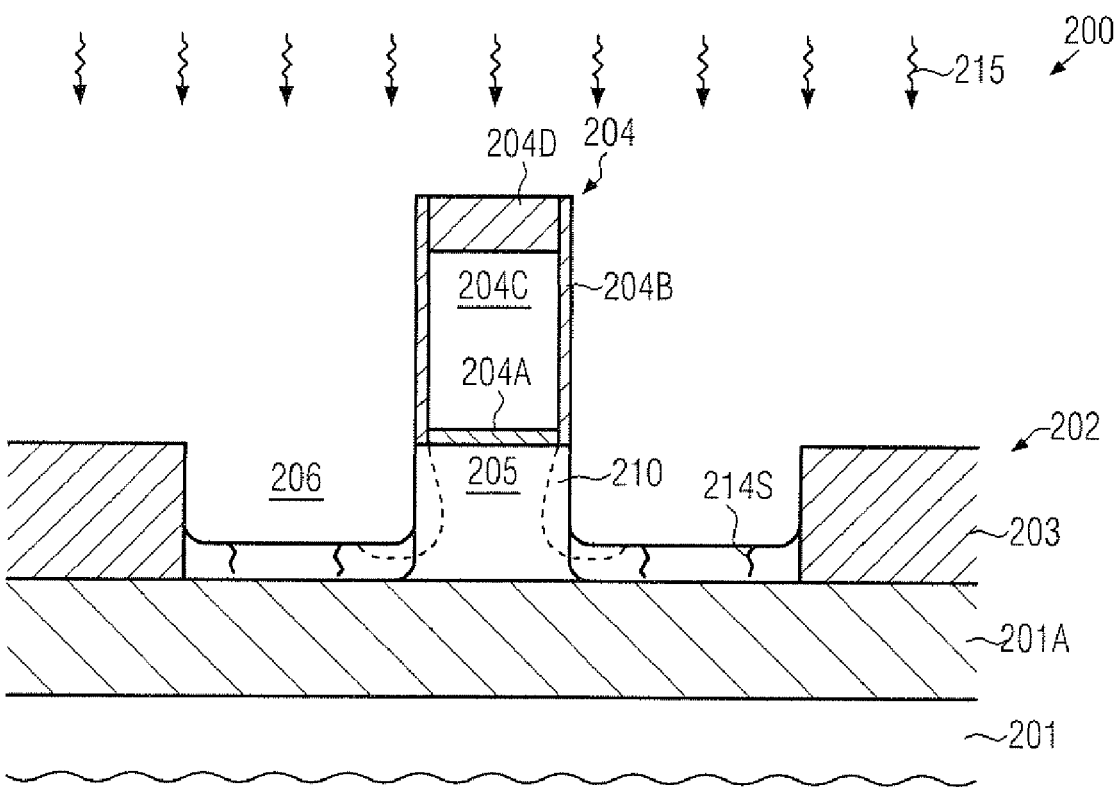

FIG. 2d schematically illustrates the semiconductor device 200 according to some illustrative embodiments in which a heat treatment 215 may be applied when implantation-induced damage, as indicated by 214S, may be considered inappropriate during a subsequent selective epitaxial growth process. In other cases, a preceding amorphization may be re-crystallized, thereby also activating dopant species to a certain degree. It should be appreciated that the heat treatment 215 may be performed on the basis of any appropriate process parameters using well-established techniques, such as laser anneal, flashlight anneal and the like. For instance, if desired, appropriate process parameters may be selected in which a re-crystallization may occur without inducing significant dopant diffusion. In other cases, the heat treatment 215 may be omitted in this manufacturing stage when corresponding implantation-induced damage is considered not to be relevant. After the implantation sequence 212 or after the heat treatment 215, the device 200 may be prepared for a subsequent selective epitaxial growth process. For this purpose, any appropriate wet chemical cleaning processes may be performed, wherein the spacer 204B may preserve integrity of the gate insulation layer 204A, if comprised of a sensitive high-k dielectric material.

Figure 2E:
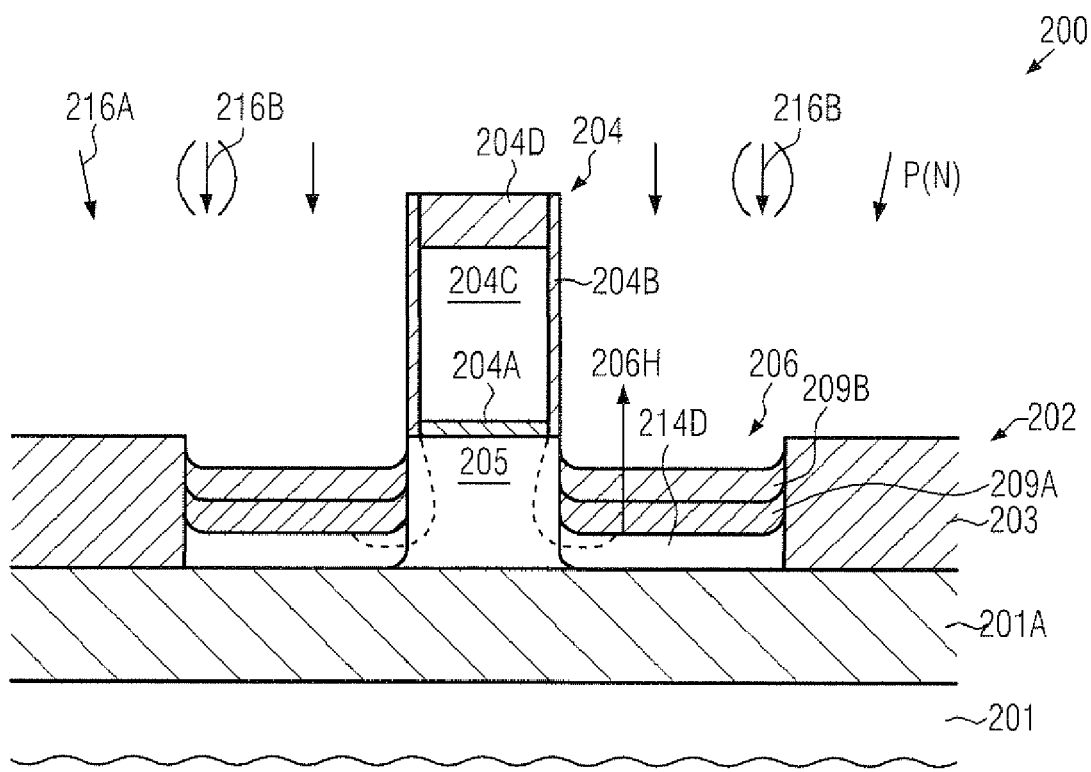

FIG. 2e schematically illustrates the semiconductor device 200 during a selective epitaxial growth process 216A, during which a strain-inducing semiconductor material 209A may be grown within the cavities 206. During process 216A, an appropriate dopant species, such as an N-type species or a P-type species, may be incorporated into the deposition ambient in order to form the material 209A as an in situ doped material. For this purpose, well-established deposition recipes may be used, as is also previously described. For example, the material 209A may represent a silicon/germanium alloy when the device 200 requires a compressive strain component. In other cases, a silicon/germanium/tin alloy may be deposited, while, in still other cases, a silicon/tin mixture may be formed in order to obtain a desired compressive strain component. In other illustrative embodiments, the material 209A may be provided in the form of a silicon/carbon alloy when the transistor 200 may require a tensile strain component. Thus, a high degree of flexibility may be obtained by selecting an appropriate material composition, which may significantly influence the overall strain component, and also by selecting an appropriate dopant concentration. For example, the concentration of the layer 209A may be selected moderately high to establish, in combination with the previously implanted deep drain and source species 214D, a desired overall dopant concentration. In a subsequent phase or in a separate step, indicated as 216B, a further material layer 209B may be deposited, wherein at least a dopant concentration may be different compared to the concentration in the layer 209A. For example, a reduced dopant concentration may be provided so that the layer 209B may act as a "buffer" layer. In other cases, the material 209A may be provided with a reduced dopant concentration compared to the layer 209B, depending on the desired final drain and source profile. Thus, the dopant concentration may vary along a height direction 206H due to the different process parameters of the deposition phases or steps 216A, 216B. It should be appreciated that a corresponding change of the dopant concentration may occur within 1 nm or less along the direction 206H, depending on the corresponding process parameters. In this case, a more or less step-like variation of the dopant concentration may be obtained, while, in other cases, a less pronounced transition may occur, wherein, nevertheless, a corresponding change of concentration may be reliably detected within the layers 209A, 209B along the direction 206H. It should be appreciated that a corresponding variation of a dopant concentration may also be referred to as a graded dopant concentration.

Figure 2F:
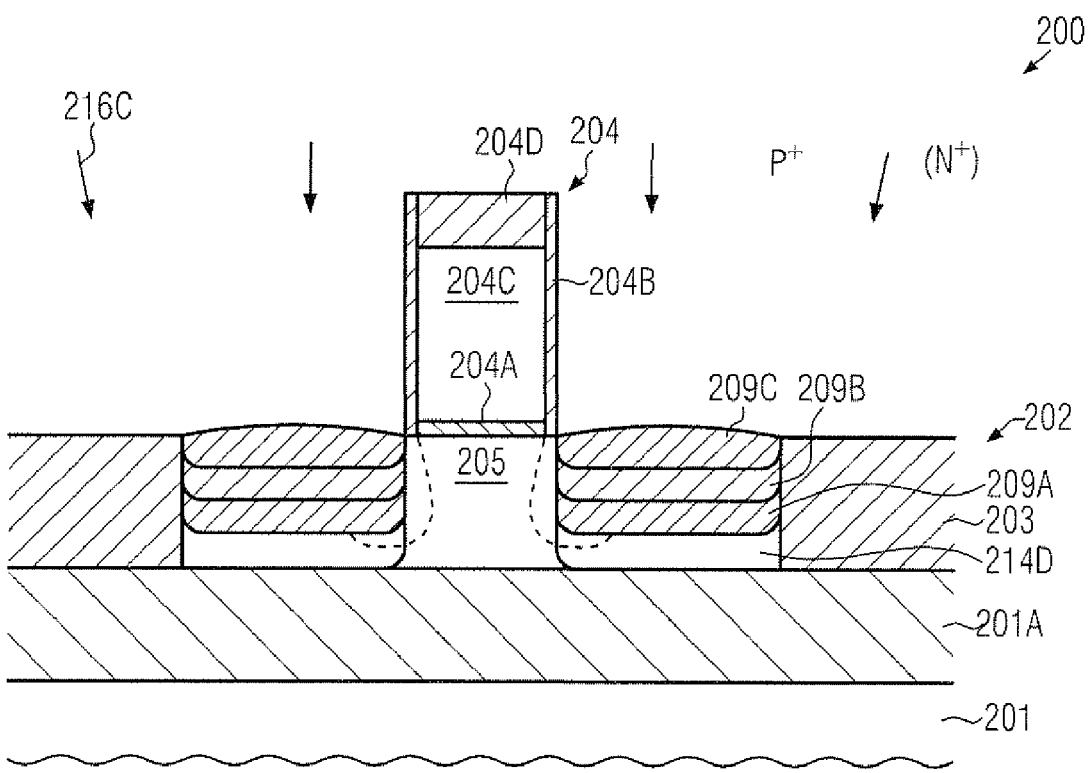

FIG. 2f schematically illustrates the semiconductor device 200 during a further selective growth process or phase 216C, in which a final or extension layer 209C may be provided with an appropriate in situ concentration in order to provide drain and source extension regions in combination with one or more heat treatments to be performed in a later manufacturing stage. It should be appreciated that, in addition to the in situ doping, the material composition may also be modified with respect to the layers 209B, 209A, if considered appropriate. Consequently, on the basis of two or more of the deposition processes 216A, 216B, 216C, any appropriate number of epitaxially grown layers of strain-inducing semiconductor material may be formed, wherein, in at least some of these layers, a different in situ doping may be provided to comply with requirements for forming a complex drain and source dopant profile in combination with any subsequent heat treatments. Thus, it should be appreciated that two layers of strain-inducing semiconductor material or more than three layers may be provided, while, in other cases, a more or less continuous variation of the in situ dopant concentration may be applied. Thus, contrary to conventional approaches, a significantly non-constant in situ dopant concentration along the height direction 206H (FIG. 2e) may be used in order to provide appropriate start conditions for a subsequent heat treatment during which the final dopant profile may be determined.

Figure 2G:
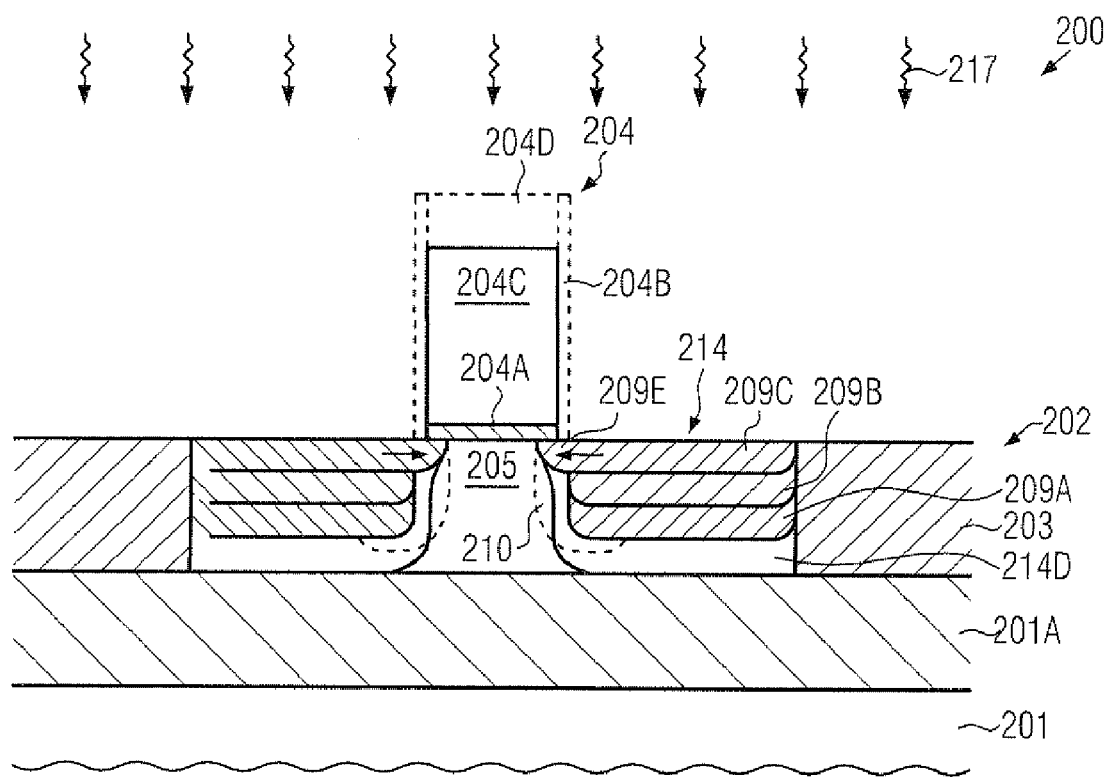

FIG. 2g schematically illustrates the semiconductor device 200 when subjected to a heat treatment 217, for instance in the form of a laser anneal process, a flashlight anneal process and the like, in which appropriate process parameters may be applied to obtain a desired degree of dopant diffusion in order to establish drain and source regions 214 on the basis of the drain and source dopant species 214D and the various dopant species incorporated in the layers 209A, 209B, 209C. It should be appreciated that the diffusion behavior may also depend on the previously implanted species 210 forming corresponding halo or counter-doped regions so that, during the process 217, a corresponding final dopant profile for the drain and source regions 214 may be obtained. For example, respective extension regions 209E may be obtained on the basis of the layer 209C, which may comprise an appropriate dopant concentration so as to avoid undue penetration of the channel region 205. Furthermore, an appropriate lateral shape may be obtained by correspondingly adjusting the in situ doping level in the layer 209B, which may act as a buffer layer, while the layer 209A in combination with the species 214D may provide a deep drain/source area. It should be appreciated that one or more additional heat treatments may be performed at any appropriate manufacturing stage after providing the strain-inducing semiconductor alloy 209A, 209B, 209C, depending on the overall process and device requirements. Furthermore, generally the heat treatment 217 may be performed at reduced process temperatures since a pronounced re-crystallization of implantation-induced damage may not be required. Thus, the materials 209A, 209B, 209C may be provided in a substantially non-damaged state, thereby obtaining a high strain transfer efficiency into the channel region 205, wherein a desired reduced offset defined by the spacer element 204B may contribute to a high strain-inducing efficiency. Consequently, the drain and source regions 214 may be provided on the basis of a manufacturing sequence without requiring complex spacer structures and a plurality of masking steps, as may typically be required in conventional strategies.

It should be appreciated that, prior to or after the anneal process 217, the offset spacer 204B in combination with the mask layer 204D may be removed, for instance on the basis of well-established wet chemical etch recipes and the like. Thereafter, the further processing may be continued, for instance by forming a spacer element and performing a silicidation process, if required. Thus, during the preceding process sequence, the spacer 204B may reliably preserve integrity of the gate insulation layer 204A and of the gate electrode material 204C and may be removed at a manufacturing stage in which exposure to critical wet chemical etch recipes, such as diluted hydrofluoric acid, may be avoided.

Figure 2H:
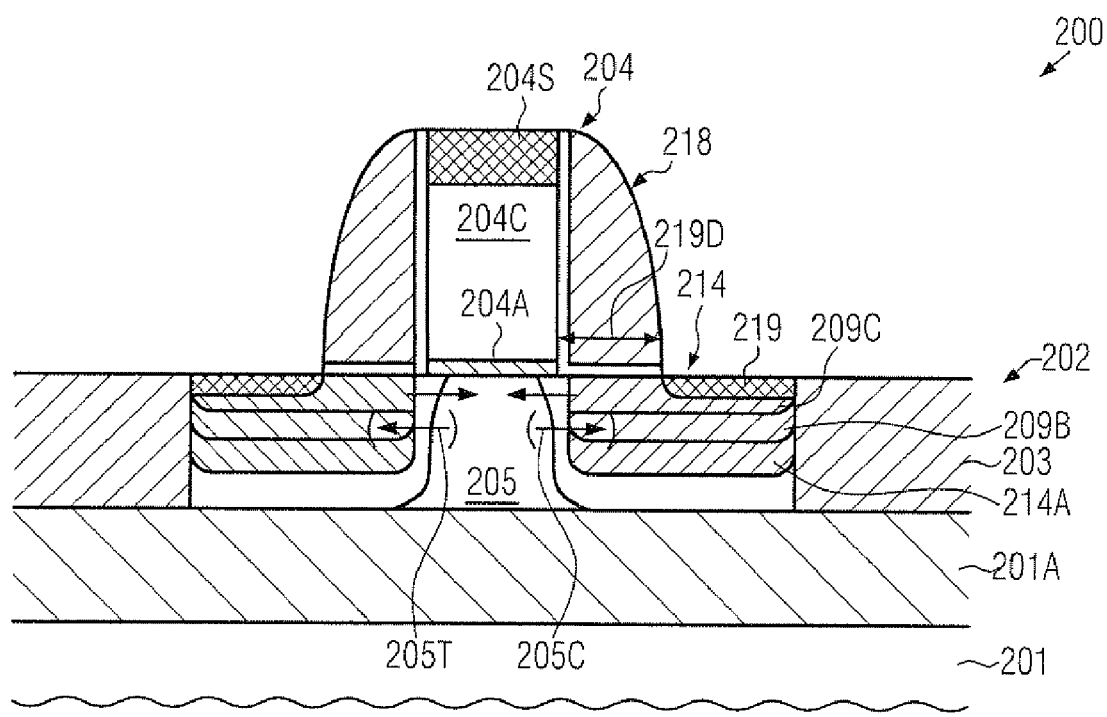

FIG. 2h schematically illustrates the device 200 with a spacer structure 218, which may have an appropriate width so as to adjust an offset 219D of metal silicide regions 219 with respect to the channel region 205. The spacer structure 218 may be comprised of any appropriate material, such as silicon nitride, possibly in combination with silicon dioxide as an etch stop material and the like. Furthermore, a metal silicide region 204S may be formed in the electrode material 204C when comprised of polysilicon material. In other cases, the material 204S may be removed in a later manufacturing stage, for instance by replacing at least a part of the electrode material 204C by highly conductive metal. It should be appreciated that the spacer structure 218 may be provided on the basis of a target width that has been selected so as to obtain the offset 219 to provide enhanced transistor performance, for instance by avoiding undue "transfer" of dopants towards the channel region 205, which may be caused during the silicidation process. Thus, the characteristics of the spacer structure 218 may be adapted to process parameters of the silicidation process and corresponding materials used, such as nickel, platinum, cobalt and the like, thereby also contributing to enhanced overall transistor performance. If desired, the spacer structure 218 may be removed after forming the metal silicide regions 219, for instance in view of enhancing stress transfer of any dielectric material that may be deposited above the completed transistor structure, thereby enabling the deposition of an increased amount of highly stressed dielectric material in close proximity to the channel region 205.

As a consequence, the transistor 200 may comprise the strain inducing material 209A, 209B, 209C in a superior crystalline state, thereby inducing a high strain component 205C or 205T, such as a compressive component or tensile component, depending on the material composition of the strain-inducing alloy. Furthermore, a graded in situ dopant concentration in the materials 209A, 209B, 209C may result in a desired lateral and vertical profile of the drain and source regions 214, thereby allowing the materials 209C, 209B, 209A to be positioned in close proximity to the channel region 205, which may also contribute to superior strain transfer efficiency.

As a result, the present disclosure provides semiconductor devices and techniques for forming the same in which a graded dopant profile may be established in an epitaxially grown strain-inducing semiconductor material, which may therefore be positioned in close proximity to the channel region without compromising the resulting dopant profile. Furthermore, additional implant species may be incorporated prior to the epitaxial growth of the strain-inducing semiconductor alloy, wherein the presence of the corresponding cavities may provide enhanced implantation conditions. The drain and source dopant profiles may be obtained without requiring complex spacer structures, which may contribute to a significantly reduced complexity in forming sophisticated transistor elements.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    forming cavities in an active region of a transistor laterally adjacent to a gate electrode structure, said gate electrode structure comprising a gate dielectric material, an electrode material formed on said gate dielectric material and an offset sidewall spacer;
introducing at least one further dopant species into said active region through said cavities to form source and drain regions extending to at least a buried insulating layer below the active region;
forming a strain-inducing semiconductor alloy in said cavities after introducing said at least one further dopant species into said active region, said strain-inducing semiconductor alloy comprising a dopant species having a varying dopant concentration along a height direction of said cavities; and
performing a heat treatment to form drain and source extension regions on the basis of said varying dopant concentration of said dopant species, said drain and source extension regions connecting to a channel region of said transistor.

2. The method of claim 1, further comprising introducing said at least one further dopant species into said active region through said cavities by performing an implantation process.

3. The method of claim 2, wherein introducing said at least one further dopant species comprises introducing a dopant species determining the same conductivity type as said dopant species for forming drain and source regions in combination with said dopant species.

4. The method of claim 3, wherein introducing said at least one further dopant species comprises introducing a counter-doping species relative to said dopant species for forming a counter-doped region relative to said drain and source regions.

5. The method of claim 2, wherein introducing said at least one further dopant species comprises performing the implantation process using an implantation energy selected based upon an ion blocking capability of the gate electrode structure.

6. The method of claim 1, wherein forming said strain-inducing semiconductor alloy comprises forming a buffer layer and forming an extension layer above said buffer layer, wherein a dopant concentration of said buffer layer is less than a dopant concentration of said extension layer.

7. The method of claim 1, wherein forming said strain-inducing semiconductor alloy comprises forming a germanium-containing material by performing a selective epitaxial growth process.

8. The method of claim 1, wherein forming said strain-inducing semiconductor alloy comprises forming a tin-containing material by performing a selective epitaxial growth process.

9. The method of claim 1, wherein forming said strain-inducing semiconductor alloy comprises forming a carbon-containing material by performing a selective epitaxial growth process.

10. A method, comprising:
forming cavities in an active region of a transistor laterally adjacent to a gate electrode structure, said gate electrode structure comprising a gate dielectric material, an electrode material formed on said gate dielectric material and an offset sidewall spacer;
introducing at least one further dopant species into said active region through said cavities, wherein introducing said at least one further dopant species comprises performing an implantation process;
forming a strain-inducing semiconductor alloy in said cavities, said strain-inducing semiconductor alloy comprising a dopant species having a varying dopant concentration along a height direction of said cavities;
performing a heat treatment to form drain and source extension regions on the basis of said varying dopant concentration of said dopant species, said drain and source extension regions connecting to a channel region of said transistor; and
performing a second heat treatment to re-crystallize crystalline damage prior to forming said strain-inducing semiconductor alloy.

11. A method, comprising:
forming cavities in an active region of a transistor laterally adjacent to a gate electrode structure, said gate electrode structure comprising a gate dielectric material, an electrode material formed on said gate dielectric material and an offset sidewall spacer;
forming a strain-inducing semiconductor alloy in said cavities, said strain-inducing semiconductor alloy comprising a dopant species having a varying dopant concentration along a height direction of said cavities; and
performing a heat treatment to form drain and source extension regions on the basis of said varying dopant concentration of said dopant species, said drain and source extension regions connecting to a channel region of said transistor, and wherein forming said strain-inducing semiconductor alloy comprises forming a buffer layer and forming an extension layer above said buffer layer, wherein a dopant concentration of said buffer layer is higher than a dopant concentration of said extension layer.

12. A method of forming drain and source regions of a transistor, the method comprising:
implanting a first portion of a drain and source dopant species through cavities into an active region of said transistor to form source and drain regions extending to at least a buried insulating layer below the active region;
forming a strain-inducing semiconductor alloy in said cavities after implanting the first portion of the drain and source dopant species, said strain-inducing semiconductor alloy comprising a second portion of said drain and source dopant species having a graded concentration with respect to a height direction of said cavities; and
performing at least one heat treatment to form a final dopant profile of said drain and source regions on the basis of said first and second portions of said drain and source dopant species.

13. The method of claim 12, wherein forming said strain-inducing semiconductor alloy comprises forming a buffer layer in said cavities and forming an extension layer above said buffer layer, wherein a dopant concentration of said buffer layer is less than a dopant concentration of said extension layer.

14. The method of claim 12, wherein said strain-inducing semiconductor alloy comprises at least one of germanium and tin.

15. The method of claim 12, wherein said strain-inducing semiconductor alloy comprises carbon.

16. The method of claim 12, further comprising implanting a further dopant species that is counter-doping relative to said drain and source dopant species prior to forming said strain-inducing semiconductor alloy.

17. The method of claim 12, wherein said first portion of said drain and source dopant species is implanted so as to extend to a buried insulating layer.

18. A method of forming drain and source regions of a transistor, the method comprising:
implanting a first portion of a drain and source dopant species through cavities into an active region of said transistor;

forming a strain-inducing semiconductor alloy in said cavities, said strain-inducing semiconductor alloy comprising a second portion of said drain and source dopant species having a graded concentration with respect to a height direction of said cavities; and performing at least one heat treatment to form a final dopant profile of said drain and source regions on the basis of said first and second portions of said drain and source dopant species, wherein forming said strain-inducing semiconductor alloy comprises forming a buffer layer in said cavities and forming an extension layer above said buffer layer, wherein a dopant concentration of said buffer layer is less than a dopant concentration of said extension layer, and wherein forming said strain-inducing semiconductor alloy comprises forming a buffer layer and forming an extension layer above said buffer layer, wherein a dopant concentration of said buffer layer is higher than a dopant concentration of said extension layer.

* * * * *